United States Patent [19]
Inoue

[11] Patent Number: 5,909,010
[45] Date of Patent: Jun. 1, 1999

[54] CHIP SIZE PACKAGE

[75] Inventor: Tatsuo Inoue, Tokyo, Japan

[73] Assignee: NEC Corporation, Tokyo, Japan

[21] Appl. No.: 08/912,337

[22] Filed: Aug. 18, 1997

[30] Foreign Application Priority Data

Aug. 21, 1996 [JP] Japan .................................. 8-218980

[51] Int. Cl.$^6$ .................................................. H01L 25/00
[52] U.S. Cl. ........................................ 174/260; 361/783
[58] Field of Search .................................. 257/778, 782, 257/783, 777, 684, 738; 228/180.22, 180.21; 361/728, 736, 768, 767, 772; 174/253, 260, 52.4, 250; 438/108, 461, 126

[56] References Cited

U.S. PATENT DOCUMENTS

| | | | |
|---|---|---|---|
| 4,616,406 | 10/1986 | Brown | 29/588 |
| 4,772,936 | 9/1988 | Reding et al. | 257/668 |
| 5,148,265 | 9/1992 | Khandros et al. | 257/773 |
| 5,258,648 | 11/1993 | Lin | 257/778 |
| 5,367,763 | 11/1994 | Lam | 29/827 |
| 5,477,611 | 12/1995 | Sweis et al. | 29/840 |
| 5,528,083 | 6/1996 | Malladi et al. | 257/786 |
| 5,543,663 | 8/1996 | Takubo | 257/720 |
| 5,612,514 | 3/1997 | Lam | 174/261 |
| 5,616,953 | 4/1997 | King et al. | 257/666 |
| 5,663,106 | 9/1997 | Karavakis et al. | 29/841 |
| 5,677,575 | 10/1997 | Maeta et al. | 257/778 |
| 5,684,330 | 11/1997 | Lee | 257/692 |
| 5,703,407 | 12/1997 | Hori | 257/783 |

FOREIGN PATENT DOCUMENTS

| | | |
|---|---|---|
| 382203 | 8/1990 | European Pat. Off. . |
| 4252054 | 9/1992 | Japan . |

OTHER PUBLICATIONS

Microelectronics Packaging Handbook: 6.3 Controlled Collapse Chip Connection 9C4) published by Van Nostrand Reinhold, 1989, pp. 366–373.

Wakabayashi et al, "Chip Size Package", SHM Society Report, vol. 11, No. 5, Sep. 1, 1995, pp. 3–8.

Kata et al, "Trend of CSP Technology Development", the SHM Society Report, vol. 11, No. 5, Sep. 1, 1995, pp. 9–13.

T. Distefano et al., "Chip–Scale Packaging Meets Future Design Needs", Solid State Technology vol. 39, No. 4, Apr. 1, 1996, pp. 82–84, 86, 88 and 90 and Table 1.

L. Gilg, "Known Good Die Meets Chip Size Package Surface Mountable CSPS Ruggedize ICS For Handling Full Testing and Assembly", IEEE Circuits and Devices Magazine, vol. 11, No. 4, Jul. 1, 1995, pp. 32–37.

*Primary Examiner*—Kristine Kincaid
*Assistant Examiner*—William Silverio
*Attorney, Agent, or Firm*—Sughrue, Mion, Zinn, Macpeak & Seas, PLLC

[57] ABSTRACT

A CSP (Chip Size Package) of the present invention includes a semiconductor IC (Integrated Circuit) chip having I/O (Input/Output) terminals along its edges. A small size substrate has a smaller contour than the chip and has a plurality of metal terminals arranged along the edges of its bottom, and a plurality of metal bumps arranged on its top in a lattice configuration. The top of the chip and the bottom of the substrate are so configured as to be electrically connected to each other via a tape member including a plurality of leads. These leads each include a first terminal to be electrically connected to the associated I/O terminal of the chip, and a second terminal to be electrically connected to the associated metal terminal of the substrate.

27 Claims, 11 Drawing Sheets

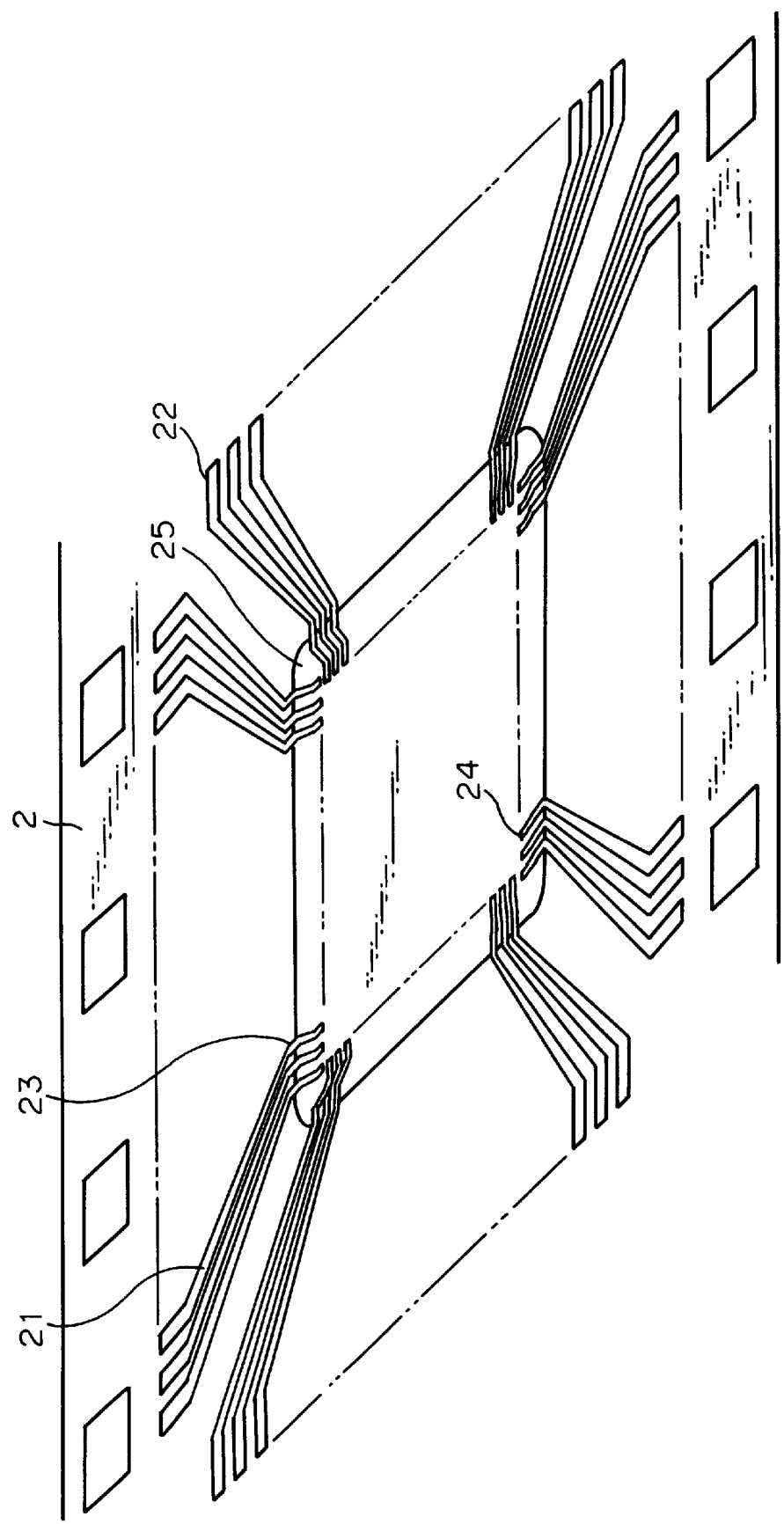

CHIP SIZE PACKAGE

BACKGROUND OF THE INVENTION

The present invention relates to a small size, light weight LSI (Large Scale Integrated circuit) package and, more particularly, to a chip size package (CSP).

In parallel with advances in semiconductor technologies, LSI chips evolved from semiconductor ICs (Integrated Circuits) and are increasing in integration scale. Today, it is even possible to accommodate the entire electronic apparatus in a single LSI chip. Portable computers, handy phones and digitized portable electronic apparatuses are recent achievements derived from the above circumstances. With these electronic apparatuses, there is an increasing demand for a small size, light weight configuration. To meet this demand, LSI packages for mounting LSI chips must be reduced in size and weight.

On the other hand, a large scale computer, telephone exchange or similar system is constituted by the combination of a great number of LSI chips. With this kind of system, it is necessary to promote rapid propagation of signals between the LSI chips, and therefore to reduce the distance between nearby LSI chips. This can be done most effectively if the size of the individual LSI package is reduced.

A small size, light weight LSI package can be implemented by a tape carrier system called TAB (Tape Automated Bonding) or a system allowing LSI chips, generally referred to as flip chips, to be directly mounted. TAB is described in detail in Japanese Patent Laid-Open Publication No. 4-252054. A flip chip is discussed in "Microelectronics Packaging Handbook: 6.3 CONTROLLED COLLAPSE CHIP CONNECTION (C4)" published by VAN NOSTRAND REINHOLD, 1989, pp. 366–373.

Recently, a chip size package (CSP) has been proposed in various forms as an LSI package capable of solving various problems of TAB and flip chips and having an extremely small size. CSPs are taught in Wakabayashi et al. "Chip Size Package", the SHM Society Report, Vol. 11, No. 5, Sep. 1, 1995, pp. 3–8, and Kata et al. "Trend of CSP Technology Development", the SHM Society Report, Vol. 11, No. 5, Sep. 1, 1995, pp. 9–13.

The problem with the conventional LSI package is that when implemented by TAB, the package has a contour noticeably grater than the contour of an LSI chip. On the other hand, when the flip chip scheme is used, it is difficult to guarantee reliability including the protection of the LSI chip.

SUMMARY OF THE INVENTION

It is therefore an object of the present invention to provide a small size, light weight CSP capable of protecting an LSI chip from the environment, which is also inexpensive, and as small as an LSI chip.

A CSP of the present invention includes a semiconductor IC chip having I/O (Input/Output) terminals formed at its edges. A small size substrate has a smaller contour than the IC chip, and includes a plurality of metal terminals formed at edges of its bottom and a plurality of metal bumps arranged on its top in a lattice configuration. A tape member includes a plurality of leads each having a first terminal to be electrically connected to one of the I/O terminals of the IC chip and a second terminal to be electrically connected to one of the metal terminals of the substrate. The top of the IC chip and the bottom of the substrate face each other with the tape member therebetween. The IC chip and substrate are electrically connected to each other via the tape member.

BRIEF DESCRIPTION OF THE DRAWINGS

The above and other objects, features and advantages of the present invention will become apparent from the following detailed description taken with the accompanying drawings in which:

FIG. 6 is a perspective view of the a TAB tape included in the CSP of FIG. 3;

DESCRIPTION OF THE PREFERRED EMBODIMENT

Figure 1A:
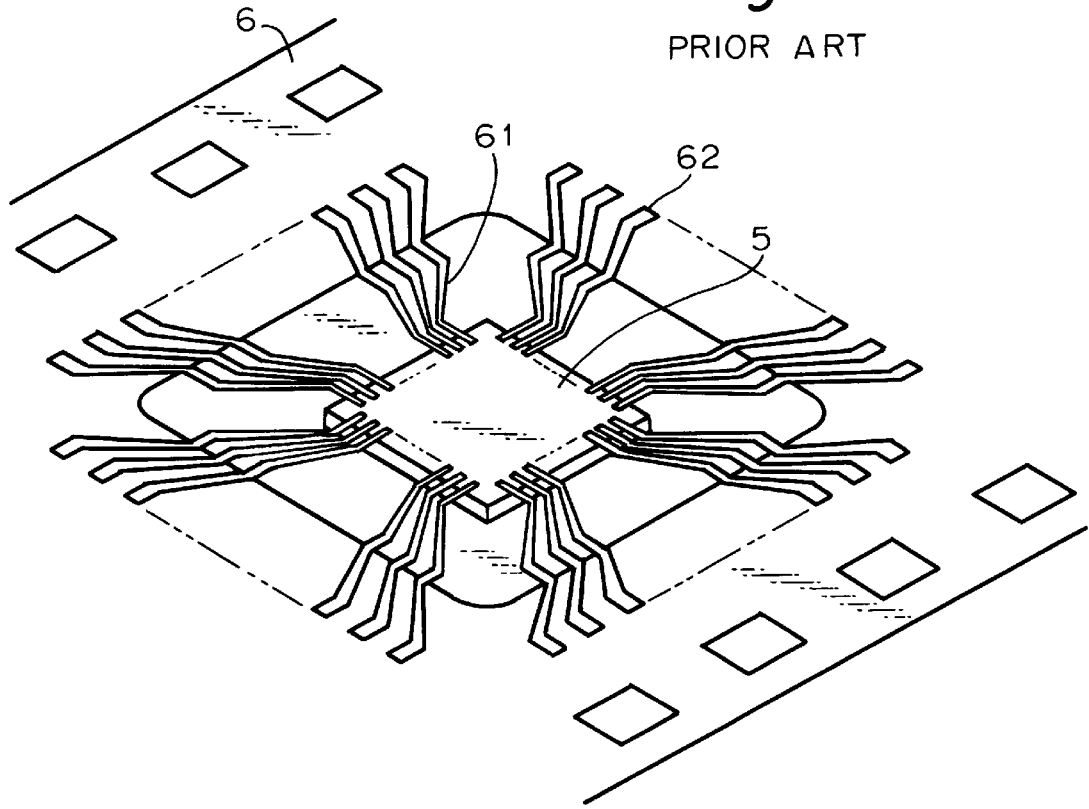
FIG. 1A shows a conventional configuration in which an LSI chip is mounted on a TAB tape.
Figure 1B:
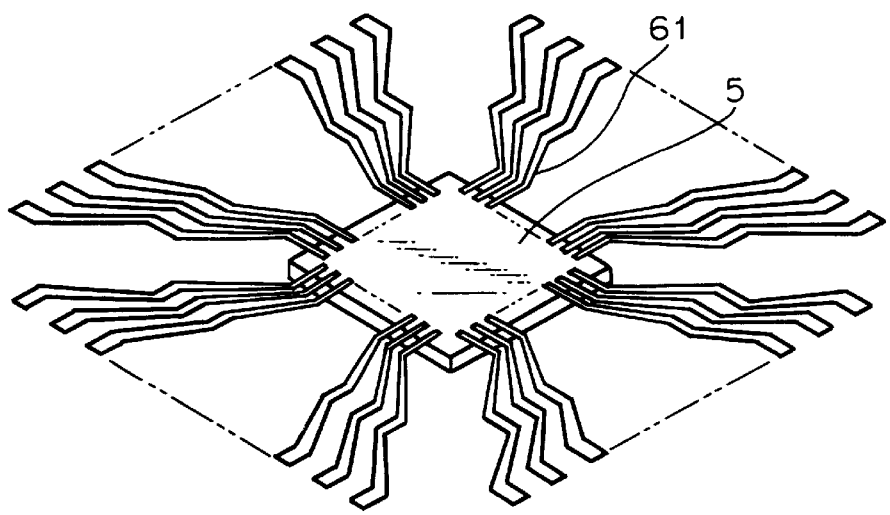
FIG. 1B shows the LSI chip of FIG. 1A cut away from the TAB tape.

To better understand the present invention, brief reference will be made to a conventional LSI package implemented by TAB, shown in FIGS. 1A and 1B. As shown, TAB leads 61 extend radially outward from an LSI chip 5. The outermost ends of the TAB leads 61 are connected to a wiring board, not shown, on which the LSI chip 5 is mounted. The problem with this configuration is that the contour of the package has far greater dimensions than those of the LSI chip 5. Test pads 62 are also shown in FIG. 1A.

Figure 2A:
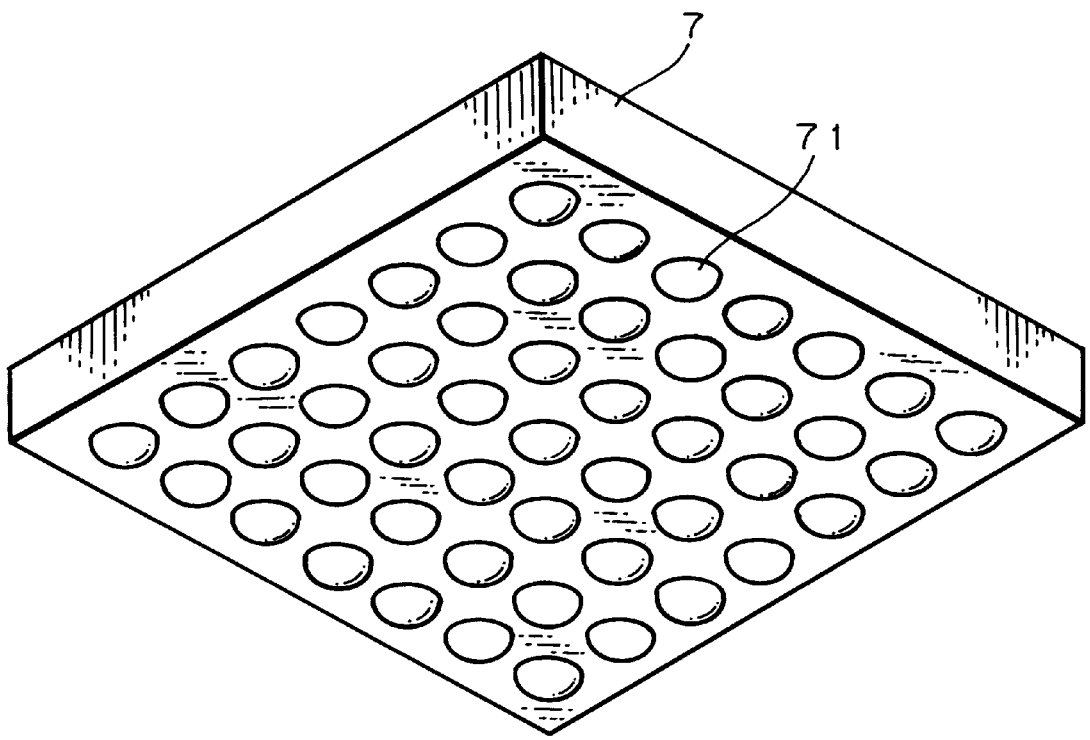
FIG. 2A is a perspective view showing another conventional LSI package including an LSI chip or flip chip.
Figure 2B:
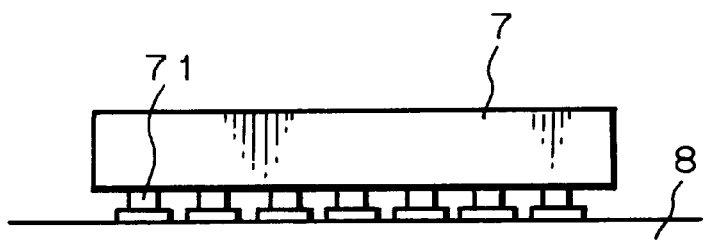
FIG. 2B is a side elevation showing the LSI chip of FIG. 2A mounted on a wiring board.

FIGS. 2A and 2B show another conventional LSI package allowing an LSI chip or flip chip to be directly mounted. As shown, an LSI chip 7 is formed with I/O bumps 71 on its bottom and connected to a wiring board 8 via the I/O bumps 71. Although the LSI 7 occupies only the area of the wiring board 8 equal to its own area, the chip 7 is entirely bare and lacks in reliability including protection from damage.

Figure 3:
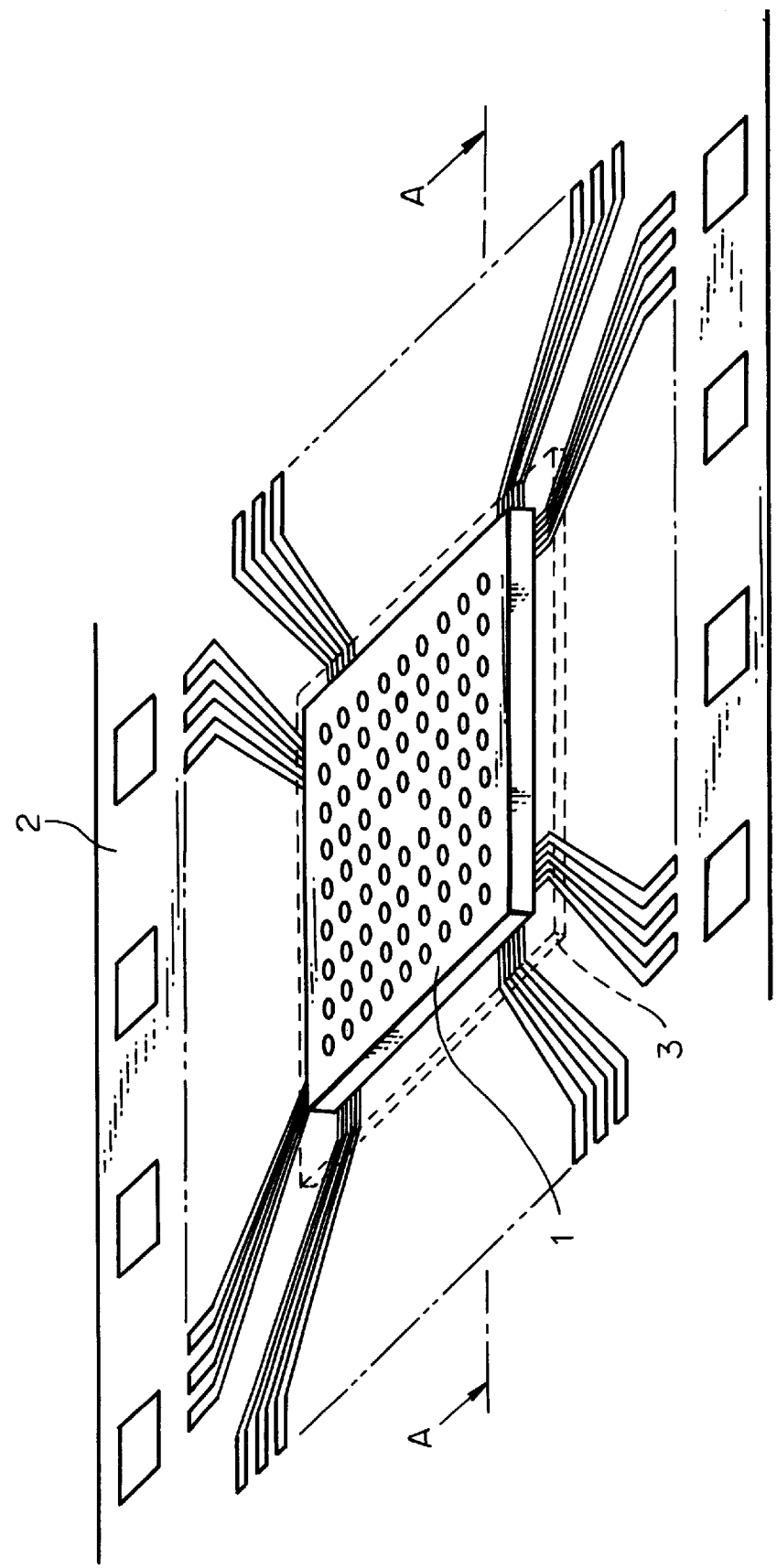
FIG. 3 is a perspective view showing a CSP embodying the present invention.
Figure 4:
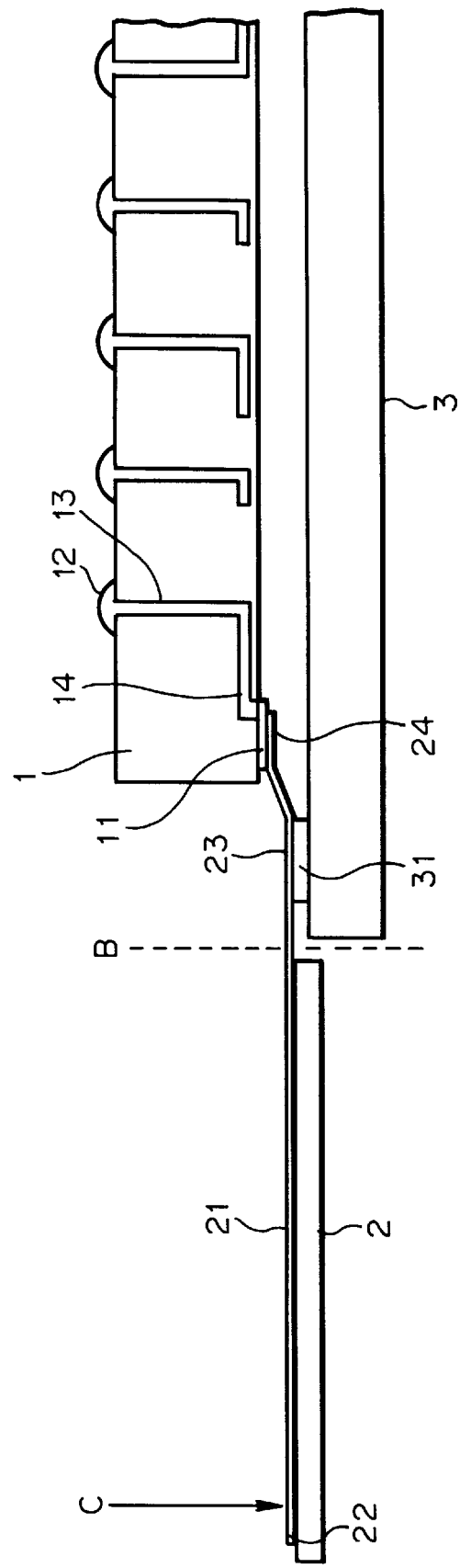
FIG. 4 is a section along line A—A of FIG. 3.

Referring to FIGS. 3 and 4, a CSP embodying the present invention is shown and includes a small size substrate 1. Metal terminals 11 are arranged on the bottom of the substrate 1 and affixed by thermocompression bonding to terminals 24 formed in the inner portion of a TAB tape 2. The metal terminals 11 are electrically connected to leads 21 also included in the TAB tape 2. Bumps 12 are formed on the top of the substrate 1. The metal terminals 11 are connected to the bumps 12 via through holes 13 and an internal wiring 14. On the other hand, terminals 31 are positioned in the peripheral portion of an LSI chip 3 and bonded to terminals 22 provided at the intermediate point of the TAB tape 2. The terminals 31 are therefore electrically connected to the metal terminals 11 of the substrate 1 via the leads 21 of the TAB tape 2. The leads 21 of the TAB tape 2 are provided with outer peripheral terminals 22. Terminals 23 are also shown in FIG. 4.

Figure 5A:
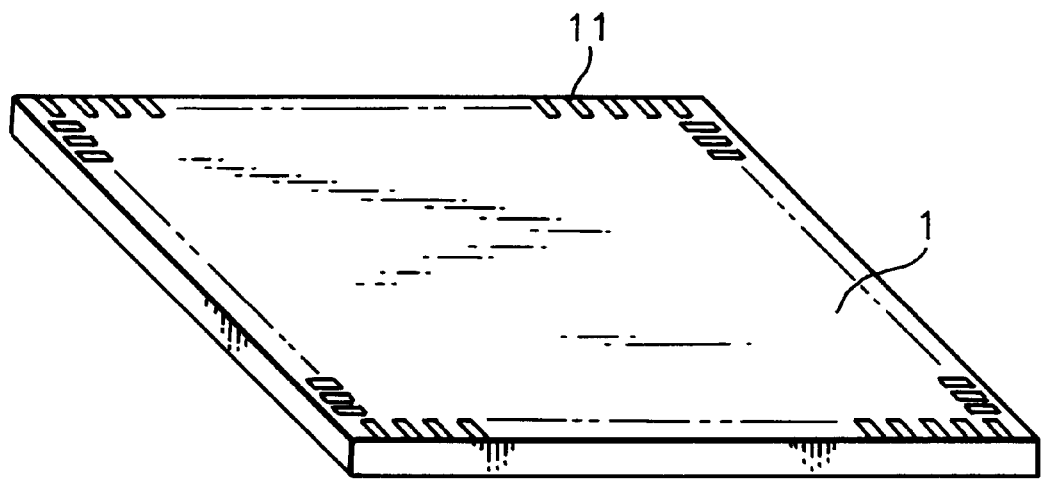
FIG. 5A is a perspective view of a small size substrate included in the CSP of FIG. 3, as seen from above.
Figure 5B:
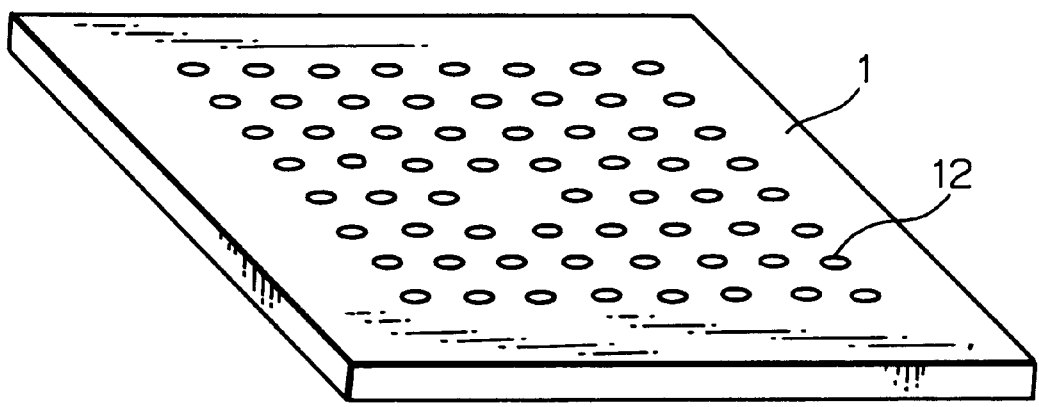
FIG. 5B is a view similar to FIG. 5A, but as seen from below.

As shown in FIGS. 5A and 5B, the metal terminals 11 are arranged along the edges of the top of the substrate 1 while the bumps 12 are arranged at the lattice points of the bottom of the substrate 1. The metal terminals 11 and bumps 12 are interconnected by the through holes 13 and internal wiring 14 formed in the substrate 1.

Figure 7:
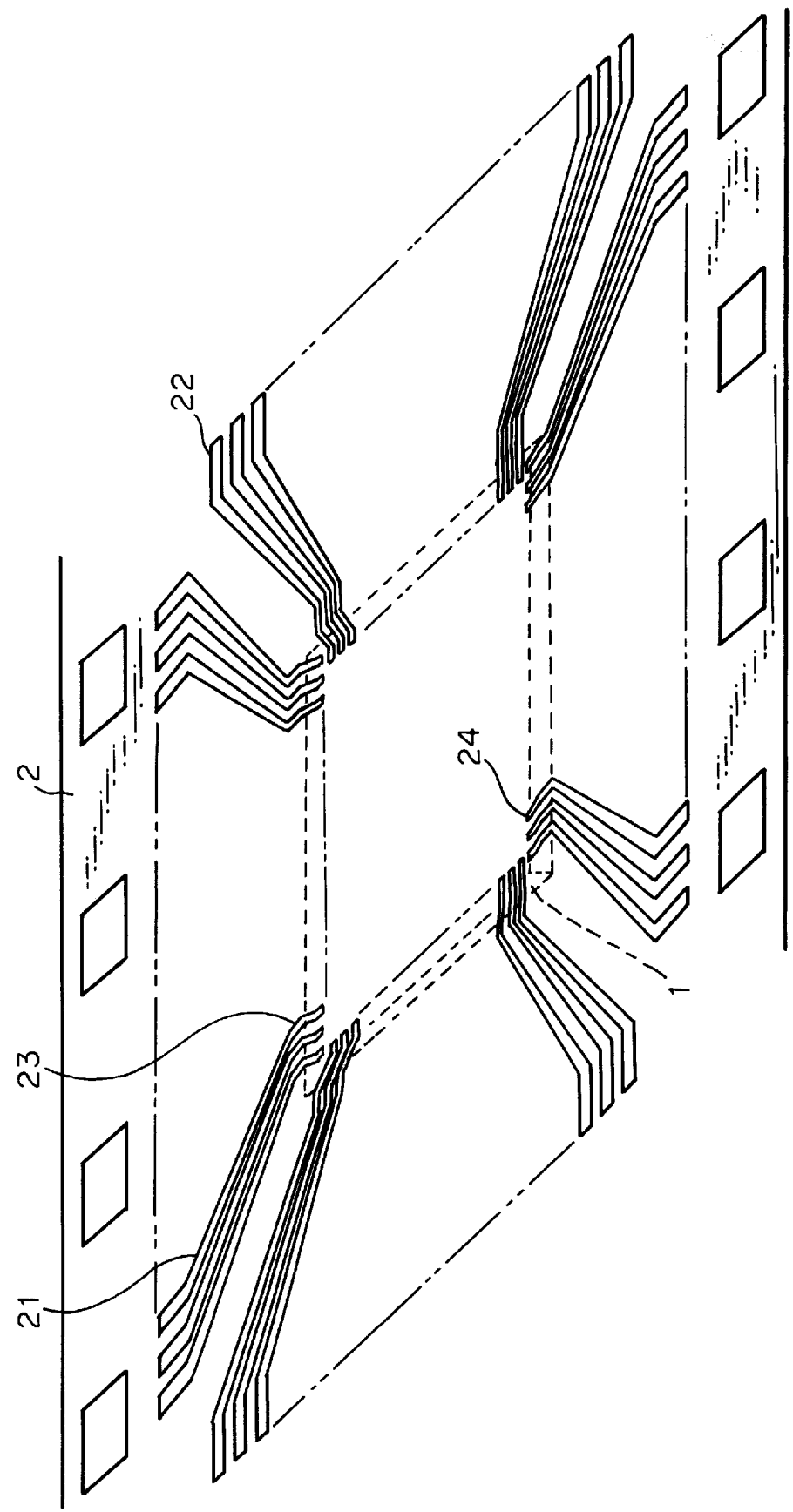
FIG. 7 is a perspective view showing the connection of the small size substrate and TAB tape.

As shown in FIGS. 6 and 7, the leads 21 of the TAB tape 2 are arranged along the edges of a device hole 25 formed in the tape 2 for mounting the substrate 1. The leads 21 each have an outer terminal 22, an intermediate terminal 23, and an inner terminal 24. The inner terminals 24 correspond in pitch and dimension to the metal terminals 11 of the substrate 1. Therefore, the inner terminals 24 of the TAB tape 2 and the metal terminals 11 of the substrate 1 are connected to each other by thermocompression bonding. The TAB tape 2 therefore appears to have the bumps 12 arranged on the lattice points of its central area.

Figure 8:
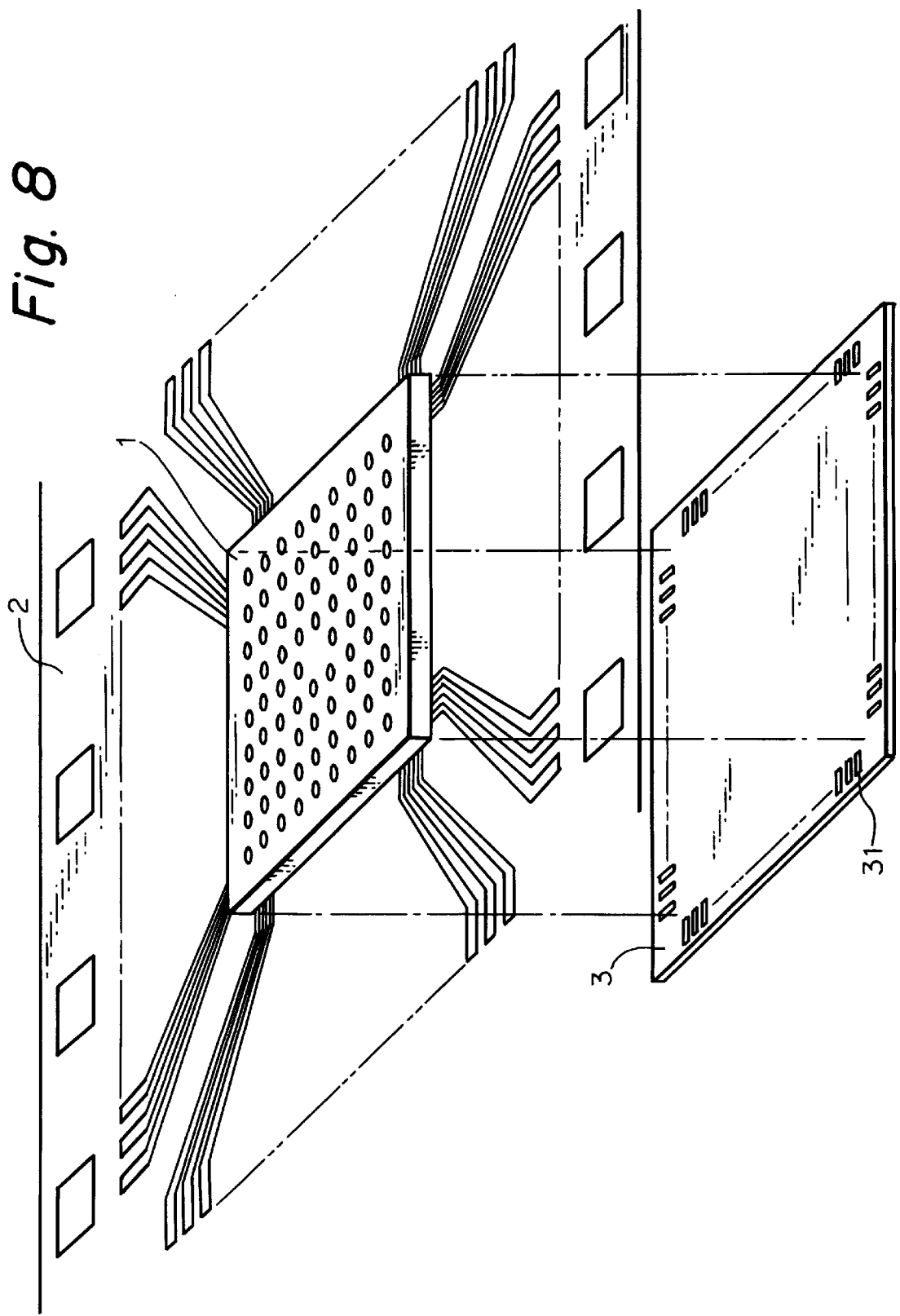
FIG. 8 shows how the LSI chip of the CSP of FIG. 3 is connected to the TAB tape to which the small size substrate is connected.

FIG. 8 shows how the LSI chip 3 of FIG. 3 is connected to the TAB tape 2 to which the substrate 1 is connected. As shown, the terminals 31 arranged in the peripheral portion of the chip 2 are bonded to the intermediate terminals 22 of the tape 2 to which the substrate 1 is connected. FIG. 8 shows the tape 2 and substrate 1 turned upside down from the position shown in FIG. 7.

By the above procedure, the bumps 12 are provided at the central area of the chip 3 via the substrate 1 and arranged at the lattice points. At the same time, the outer terminals 22 are connected to the edges of the chip 3 via the tape 2. Specifically, the leads 21 extend outward from the intermediate terminals 23 of the tape 2 connected to the terminals 31 of the chip 3. The leads 21 terminate at the outer terminals 22 at their outer ends. The outer terminals 22 are usable as test terminals for testing the electric characteristic of the LSI chip 3.

Figure 9:
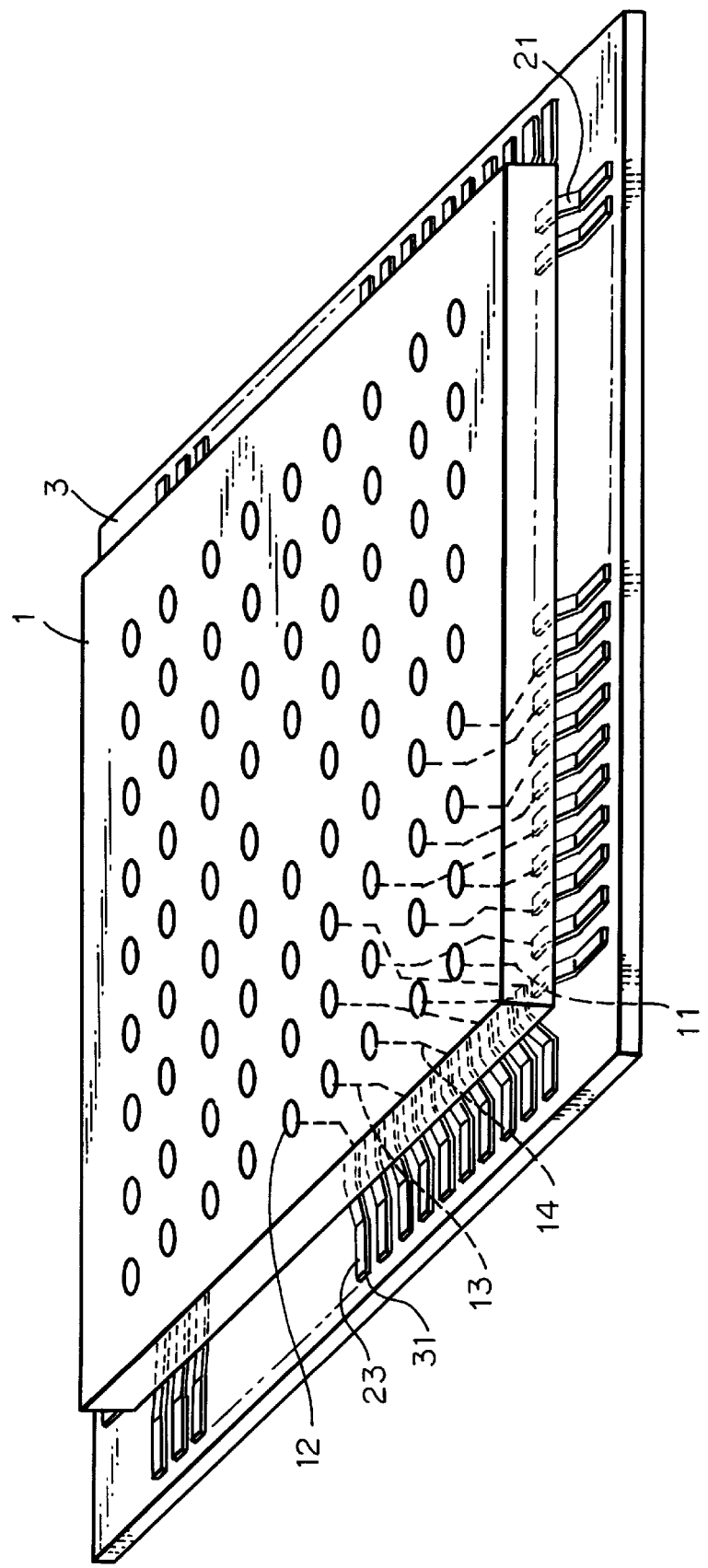
FIG. 9 is a perspective views showing the small size substrate and LSI chip cut away from the TAB tape.
Figure 10:
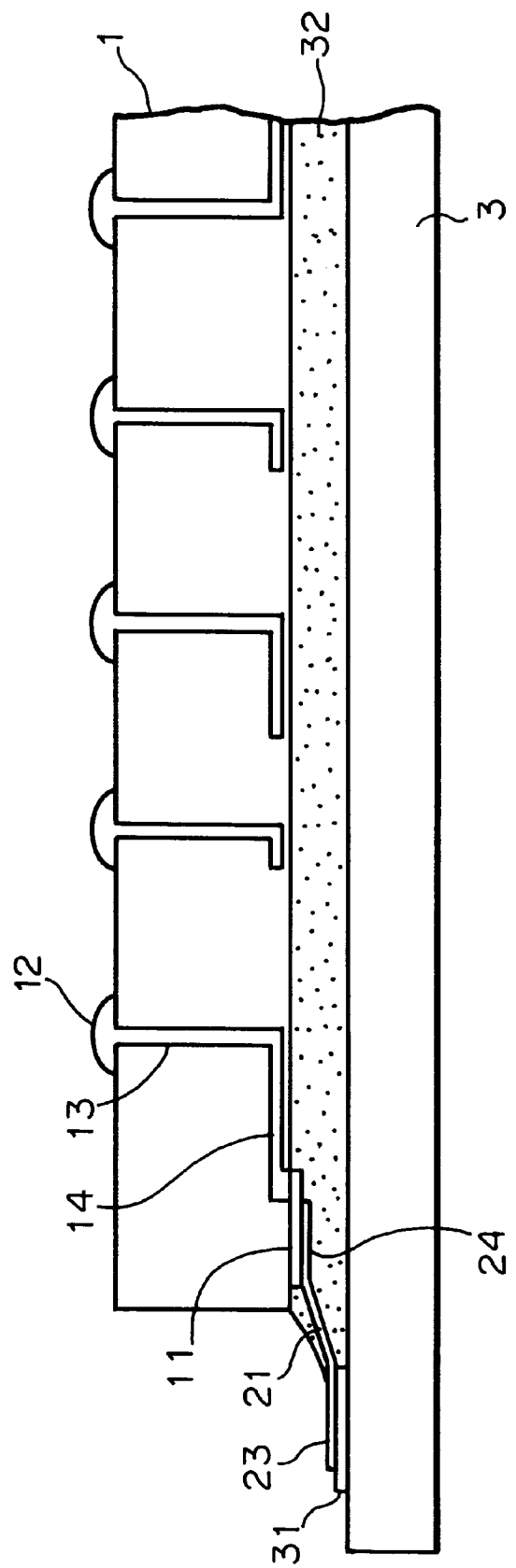
FIG. 10 is a section showing the same condition as FIG. 9.

FIGS. 9 and 10 show the substrate 1 and chip 3 cut away from the tape 2. Specifically, the electric characteristic of the chip 3 and the connection between the substrate 1 and the chip 3 are tested by use of the outer terminals 22, i.e., at a point C shown in FIG. 4. If the result of the test is satisfactory, the leads 21 of the tape 2 are cut at a point B shown in FIG. 4. As shown in FIGS. 9 and 10, the terminals 31 of the chip 3 are connected to the terminals 11 of the substrate 1 via the leads of the tape 2. The terminals 11 are in turn connected to the bumps 12 via the internal wiring 14 and through hole 13 of the substrate 1. At the final stage, epoxy resin or similar resin 32 is filled in the gap between the top or circuit surface of the chip 3 and the bottom of the substrate 1, completing a CSP.

Figure 11:
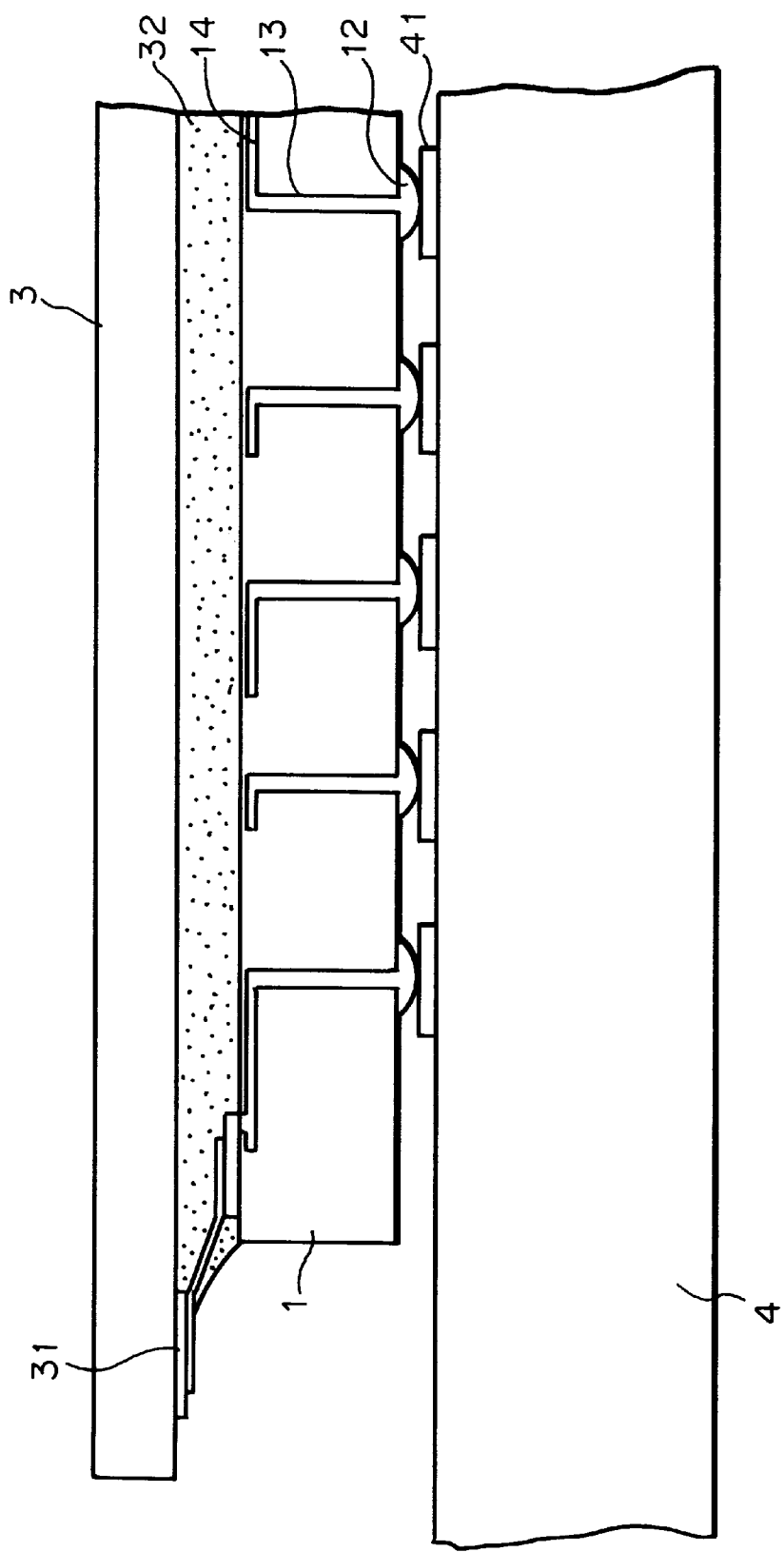
FIG. 11 is a section showing the illustrative embodiment mounted on a wiring board.

FIG. 11 shows the CSP having the above configuration and mounted on a wiring board 4. As shown, the bumps 12 positioned on the top of the substrate 1 are soldered to metal terminals 41 arranged on the wiring board 4.

As stated above, the terminals 31 are arranged along the edges of the LSI chip 3 monodimensionally at a small pitch. The terminals 31 are connected to the bumps 12 via the intermediate terminals 23, leads 21 and inner terminals 24 of the TAB tape 2 and the metal terminals 11, internal wiring 14 and through holes 13 of the substrate 1. As a result, the bumps 12 are arranged bidimensionally over the enter central area of the chip 3, i.e., the bumps 12 are rearranged at a greater pitch. The embodiment therefore promotes easier soldering and other connecting operation than the conventional scheme when the chip 3 is mounted to the wiring board 4.

The resin filling the gap between the top or circuit surface of the chip 3 and the bottom of the substrate 1 protects the top of the chip 3. Therefore, the chip 3 is easier to handle than a flip chip or similar bare chip in the event of mounting.

In summary, a CSP of the present invention includes a semiconductor IC chip having I/O terminals along its edges. A small size substrate has a smaller contour than the chip and has a plurality of metal terminals arranged along the edges of its bottom, and a plurality of metal bumps arranged on its top in a lattice configuration. The top of the chip and the bottom of the substrate are so configured as to be electrically connected to each other via a tape member including a plurality of leads. These leads each includes a first terminal t o be electrically connected to the associated I/O terminal of the chip, and a second terminal to be electrically connected to the associated metal terminal of the substrate. The CSP is therefore of small size and light weight and protects the chip from the environment. In addition, the CSP is inexpensive and substantially as small as an LSI chip.

Various modifications will become possible for those skilled in the art after receiving the teachings of the present disclosure without departing from the scope thereof.

What is claimed is:

1. A chip size package (CSP) comprising:
   a semiconductor integrated circuit (IC) chip having a top and input/output (I/O) terminals formed at edges thereof;
   a small size substrate having a smaller contour than said IC chip, and including a plurality of metal terminals formed at edges of a bottom and a plurality of metal bumps arranged on a top in a lattice configuration; and
   a tape member including a plurality of leads each having a first terminal bonded to one of said I/O terminals of said IC chip and a second terminal bonded to one of said metal terminals of said substrate, wherein said second terminal of each lead is positioned inward of a corresponding one of said first terminals, each lead of said plurality of leads further comprising a third terminal positioned outward of a corresponding one of said first terminals and outward of the edges of said IC chip, wherein each said third terminal is electrically connected to a corresponding first terminal and a corresponding second terminal;
   wherein the top of said IC chip and the bottom of said substrate face each other with said tape member therebetween, and wherein said IC chip and said substrate are electrically connected to each other via said tape member.

2. A CSP as claimed in claim 1, wherein each second terminal and each first terminal of said tape member are electrically connected to one of said metal terminals of said substrate and one of said I/O, terminals of said IC chip, respectively, wherein each third terminal is configured to effect an electrical test, and each lead has a portion between said first terminal and said third terminal that is configured to be cut.

3. A CSP as claimed in claim 2, further comprising resin filling a gap between the top of said IC chip and the bottom of said substrate.

4. A CSP as claimed in claim 3, wherein said substrate further includes an internal wiring and through holes for electrically connecting said metal terminals to preselected ones of said metal bumps.

5. A CSP as claimed on claim 4, wherein said tape member further includes a hole greater in size than said IC chip and having said first and second terminals positioned therein, and a tape portion in which said leads and third terminals are arranged along edges of said hole.

6. A CSP as claimed in claim 5, wherein said substrate further includes an internal wiring and through holes for electrically connecting said metal terminals to preselected ones of said metal bumps.

7. A CSP as claimed in claim 1, further comprising resin filling a gap between the top of said IC chip and the bottom of said substrate.

8. A CSP as claimed in claim 7, wherein said substrate further includes an internal wiring and through holes for electrically connecting said metal terminals to preselected ones of said metal bumps.

9. A CSP as claimed in claim 7, wherein said tape member further includes a hole greater in size than said IC chip and having said first and second terminals positioned therein, and a tape portion on which said leads and third terminals are arranged along edges of said hole.

10. A CSP as claimed in claim 10, wherein said substrate further includes an internal wiring and through holes for electrically connecting said metal terminals to preselected ones of said metal bumps.

11. A CSP as claimed in claim 1, wherein said tape member further includes a hole greater in size than said IC chip and having said first and second terminals positioned therein, and a tape portion on which said leads and third terminals are arranged along edges of said hole.

12. A CSP as claimed in claim 11, wherein said substrate further includes an internal wiring and through holes for electrically connecting said metal terminals to preselected ones of said metal bumps.

13. A CSP as claimed in claim 1, wherein said substrate further includes an internal wiring and through holes for electrically connecting said metal terminals to preselected ones of said metal bumps.

14. A CSP as claimed in claim 1, further comprising resin filling a gap between the top of said IC chip and the bottom of said substrate.

15. A CSP as claimed in claim 14, wherein said substrate further includes an internal wiring and through holes for electrically connecting said metal terminals to preselected ones of said metal bumps.

16. A CSP as claimed on claim 15, wherein said tape member further includes a hole greater in size than said IC chip and having said first and second terminals positioned therein, and a tape portion in which said leads and third terminals are arranged along edges of said hole.

17. A CSP as claimed in claim 16, wherein said substrate further includes an internal wiring and through holes for electrically connecting said metal terminals to preselected ones of said metal bumps.

18. A CSP as claimed in claim 1, wherein said substrate further includes an internal wiring and through holes for electrically connecting said metal terminals to preselected ones of said metal bumps.

19. A CSP as claimed in claim 1, wherein said metal bumps are spaced at a larger pitch than are said terminals of said IC chip.

20. A chip size package (CSP) comprising:
   a semiconductor integrated circuit (IC) chip having a top, a bottom, and an outer peripheral boundary, wherein input/output (I/O) terminals are formed on said top of said IC chip;
   a small size substrate having an outer periphery, a top, and a bottom, wherein a plurality of electrically conductive terminals are formed on said substrate bottom and a plurality of electrically conductive connections are formed on said substrate top;
   a tape member including a plurality of leads each having a first terminal bonded to one of said I/O terminals of said IC chip and a second terminal bonded to one of said conductive terminals of said substrate, wherein said second terminal of each lead is positioned inward of a corresponding one of said first terminals, each lead of said plurality of leads further comprising a third terminal positioned outward of a corresponding one of said first terminals and outward of the outer peripheral boundary of said IC chip, wherein each said third terminal is electrically connected to a corresponding first terminal and a corresponding second terminal;
   wherein said tape member is disposed between the top of said IC chip and the bottom of said substrate.

21. A CSP as claimed in claim 20, wherein said outer periphery of said substrate is located within the outer peripheral boundary of said IC chip.

22. A CSP as claimed in claim 20, wherein said outer periphery of said substrate does not extend outside the outer peripheral boundary of said IC chip.

23. A CSP as claimed in claim 20, wherein said substrate further includes internal wiring electrically connecting said electrically conductive terminals to said electrically conductive connections.

24. A CSP as claimed in claim 20, wherein said top of said IC chip faces said bottom of said substrate, forming a gap therebetween.

25. A CSP as claimed in claim 24, further comprising resin filling said gap.

26. A CSP as claimed in claim 20, wherein said electrically conductive connections are formed on said substrate in a bidimensional lattice.

27. A CSP as claimed in claim 20, wherein said electrically conductive connections are spaced at a pitch which is larger than the pitch of said I/O terminals of said IC chip.

* * * * *